(12) United States Patent
Choi et al.

(10) Patent No.: US 10,937,856 B2
(45) Date of Patent: Mar. 2, 2021

(54) METHOD OF MANUFACTURING A SEMICONDUCTOR DEVICE

(71) Applicant: SAMSUNG ELECTRONICS CO., LTD., Suwon-si (KR)

(72) Inventors: Jung Hun Choi, Seoul (KR); Young Tak Kim, Hwaseong-si (KR); Da Il Eom, Goyang-si (KR); Sun Jung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/424,996

(22) Filed: May 29, 2019

(65) Prior Publication Data

US 2019/0280081 A1    Sep. 12, 2019

Related U.S. Application Data

(63) Continuation of application No. 15/444,455, filed on Feb. 28, 2017, now Pat. No. 10,332,954.

(30) Foreign Application Priority Data

May 31, 2016  (KR) .......................... 10-2016-0066897

(51) Int. Cl.
*H01L 49/02* (2006.01)
*H01L 27/06* (2006.01)
*H01L 29/78* (2006.01)

(52) U.S. Cl.
CPC .......... *H01L 28/20* (2013.01); *H01L 27/0629* (2013.01); *H01L 29/7851* (2013.01)

(58) Field of Classification Search
None
See application file for complete search history.

(56) References Cited

U.S. PATENT DOCUMENTS

| 4,760,369 A | 7/1988 | Tiku |
| 6,279,585 B1 | 8/2001 | Shiraki et al. |
| 6,536,449 B1 | 3/2003 | Ranft et al. |
| 6,713,440 B2 | 3/2004 | Park et al. |
| 7,342,285 B2 | 3/2008 | Kao |
| 7,981,761 B2 * | 7/2011 | Imai ..................... H01L 23/5223 438/393 |
| 8,030,738 B2 * | 10/2011 | Shin ...................... H01L 27/115 257/538 |
| 8,040,214 B2 * | 10/2011 | Fujiwara ................. H01L 28/24 338/314 |

(Continued)

FOREIGN PATENT DOCUMENTS

| JP | 2004-266207 A | 9/2004 |
| KR | 1992-0013633 A | 7/1992 |

(Continued)

*Primary Examiner* — Long Pham
(74) *Attorney, Agent, or Firm* — Lee IP Law, P.C.

(57) ABSTRACT

A semiconductor device and a manufacturing method thereof, the semiconductor device including an insulation layer; a metal resistance pattern on the insulation layer; a spacer on a side wall of the metal resistance pattern; and a gate contact spaced apart from the spacer, the gate contact extending into the insulation layer, wherein the insulation layer includes a projection projecting therefrom, the projection contacting the gate contact.

19 Claims, 16 Drawing Sheets

(56) References Cited

U.S. PATENT DOCUMENTS

| | | | | |
|---|---|---|---|---|
| 8,159,040 B2* | 4/2012 | Coolbaugh | ......... | H01L 23/5252 |
| | | | | 257/529 |
| 8,212,649 B2* | 7/2012 | Fujiwara | ............ | H01L 23/5228 |
| | | | | 338/314 |
| 9,006,838 B2* | 4/2015 | Aggarwal | ........... | H01L 29/4916 |
| | | | | 257/369 |
| 9,190,277 B2* | 11/2015 | Nandakumar | ...... | H01L 21/2253 |
| 2010/0187654 A1* | 7/2010 | Oh | .................... | H01L 21/31116 |
| | | | | 257/532 |
| 2012/0009756 A1* | 1/2012 | Fujiwara | ................ | H01L 28/24 |
| | | | | 438/382 |
| 2015/0325483 A1 | 11/2015 | Tran et al. | | |
| 2017/0345884 A1* | 11/2017 | Choi | ................... | H01L 27/0629 |

FOREIGN PATENT DOCUMENTS

| KR | 2003-0001587 A | 1/2003 |
|---|---|---|
| KR | 10-0927410 B1 | 11/2009 |
| KR | 10-2010-0074676 A | 7/2010 |

* cited by examiner

METHOD OF MANUFACTURING A SEMICONDUCTOR DEVICE

CROSS-REFERENCE TO RELATED APPLICATIONS

This is a continuation application based on pending application Ser. No. 15/444,455, filed Feb. 28, 2017, the entire contents of which is hereby incorporated by reference.

Korean Patent Application No. 10-2016-0066897, filed on May 31, 2016, in the Korean Intellectual Property Office, and entitled: "Semiconductor Device and Manufacturing Method Thereof," is incorporated by reference herein in its entirety.

BACKGROUND

1. Field

Embodiments relate to a semiconductor device and a manufacturing method thereof.

2. Description of the Related Art

Polysilicon doped with impurities may be used as a metal resistance pattern used in a semiconductor device. For a high-performance semiconductor device, as a metal gate is used, a process of forming the metal resistance pattern by using metals may be performed.

SUMMARY

Embodiments are directed to a semiconductor device and a manufacturing method thereof.

The embodiments may be realized by providing a semiconductor device including an insulation layer; a metal resistance pattern on the insulation layer; a spacer on a side wall of the metal resistance pattern; and a gate contact spaced apart from the spacer, the gate contact extending into the insulation layer, wherein the insulation layer includes a projection projecting therefrom, the projection contacting the gate contact.

The embodiments may be realized by providing a semiconductor device including a substrate including a first region and a second region; a gate structure in first region; a source and drain region adjacent to the gate structure; a gate contact contacting the source and drain region; a metal resistance pattern in the second region; and a spacer on a side wall of the resistance pattern, wherein the gate structure and the metal resistance pattern are on regions having different heights from the substrate.

The embodiments may be realized by providing a semiconductor device including an insulation layer; a metal resistance pattern on the insulation layer; a spacer on a side wall of the metal resistance pattern; and a resistance pattern contact contacting the metal resistance pattern, wherein the resistance pattern contact includes a first lower surface and a second lower surface, the first lower surface being on a different plane from that of the second lower surface.

The embodiments may be realized by providing a method of manufacturing a semiconductor device, the method including forming a metal resistance layer on an insulation layer; forming a metal resistance pattern and a metal residue on the insulation layer by patterning the metal resistance layer, forming a spacer layer that covers the metal resistance layer and the metal residue; etching the spacer layer such that a spacer is formed that covers the side wall of the metal resistance pattern and a projection of the insulation layer that contacts the lower surface of the metal residue is formed; removing the metal residue; forming a gate contact that extends into the insulation layer, wherein the gate contact contacts the projection.

The embodiments may be realized by providing a method of manufacturing a semiconductor device, the method including forming an insulation layer; forming a metal resistance pattern on the insulation layer such that a metal residue remains on the insulation layer and spaced apart from the metal resistance pattern; forming a spacer on a side wall of the metal resistance pattern and a mask pattern on a top surface of the metal resistance pattern such that surfaces of the metal resistance pattern are unexposed; performing a residue removing process such that the metal residue is removed; forming a gate contact that extends into the insulation layer.

BRIEF DESCRIPTION OF THE DRAWINGS

Features will be apparent to those of skill in the art by describing in detail exemplary embodiments with reference to the attached drawings in which.

DETAILED DESCRIPTION

Next, a method of manufacturing a semiconductor device according to some example embodiments and a semiconductor device manufactured through the method will be described with reference to FIGS. 1 to 7.

FIGS. 1 to 7 illustrate cross-sectional views of stages in a method of manufacturing a semiconductor device according to some example embodiments.

Figure 1:
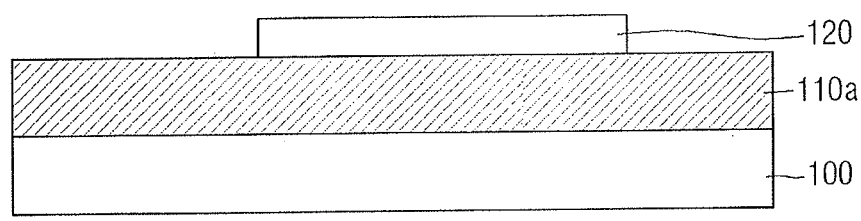
FIGS. 1 to 7 illustrate cross-sectional views of stages in a method of manufacturing a semiconductor device according to some example embodiments.

Referring to FIG. 1, a metal resistance layer 110a and a mask pattern 120 may be formed on an insulation layer 100.

The insulation layer 100 may be an etch stop layer, and may include, e.g., a silicon nitride film, a silicon oxynitride film, or a silicon oxide film. As used herein, the term "or" is not an exclusive term.

The metal resistance layer 110a may be on the insulation layer 100. The insulation layer 100 may include a metal, e.g., tungsten, copper, nickel, cobalt, aluminum, titanium, and/or tantalum, and/or a metal compound, e.g., a metal nitride.

In an implementation, a barrier layer may be included between the insulation layer 100 and the metal resistance layer 110a, and may include a barrier metal material, e.g., titanium (Ti), titanium nitride (TiN), tantalum (Ta), tantalum nitride (TaN), or titanium tungsten (TiW).

The mask pattern 120 may be formed by patterning a mask layer. For example, a hard mask layer may be formed by depositing silicon oxide, silicon nitride, or silicon oxynitride on the metal resistance layer 110a through a chemical vapor deposition (CVD) process or the like. The mask pattern 120 may be formed by performing an etching process after forming a photoresist pattern on the hard mask layer. In an implementation, the mask pattern 120 may include, e.g., silicon oxide, silicon nitride, or silicon oxynitride.

The size and the shape of the mask pattern 120 may be determined by considering a size of the metal resistance pattern to be formed in a subsequent process.

Figure 2:
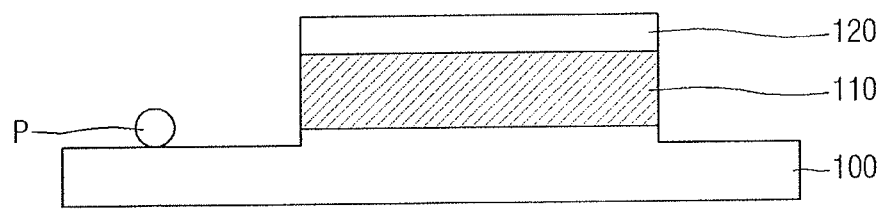

Referring to FIG. 2, the metal resistance layer 110a may be patterned by using the mask pattern 120. A metal resistance pattern 110 may be formed by patterning the metal resistance layer 110a. The metal resistance pattern 110 may be formed by removing a part of the metal resistance layer 110a on which the mask pattern 120 is not formed, through an etching process using the mask pattern 120.

In an implementation, as illustrated in FIG. 2, a part of the top of the insulation layer 100 may be removed when the metal resistance pattern 110 is formed.

A metal residue P could remain on the top of the insulation layer 100 when the metal resistance pattern 110 is formed. The metal residue P may include a same material as the metal resistance pattern 110. In an implementation, as illustrated in FIG. 2, the metal residue P may be circular or spherical. In an implementation, the metal residue P may have various shapes according to a kind of process performed when forming the metal resistance pattern 110 and a kind of metal material included in the metal resistance layer 110a. Accordingly, in the exemplary embodiment, illustrating the shape of the metal residue P as a circle is merely exemplified for describing the technical spirit of the example embodiments.

In an implementation, one metal residue P may be formed or may remain on the insulation layer 100. In an implementation, a number of metal residues P may be a multiple number.

Figure 3:
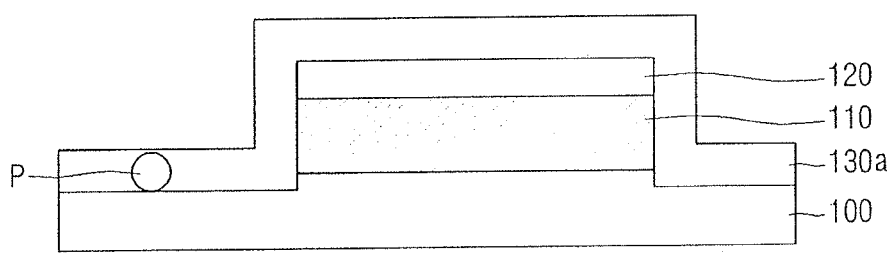

Next, referring to FIG. 3, a spacer layer 130 (that covers the insulation layer 100, the metal resistance pattern 110, the mask pattern 120, and the metal residue P) may be formed.

The forming of the spacer layer 130 may include forming the spacer layer 130 conformally by performing a deposition process on the surface of the insulation layer 100, the metal resistance pattern 110, the mask pattern 120, and the metal residue P.

In an implementation, as illustrated in FIG. 3, the spacer layer 130 may have a thickness that is greater than a height of the metal residue P and thus may cover the metal residue P. In an implementation, the thickness of the spacer layer 130 may be determined or selected regardless or independent of the size of the metal residue P.

In an implementation, the spacer layer 130 may include, e.g., silicon nitride (SiN), silicon oxynitride (SiON), silicon oxide ($SiO_2$), silicon oxycarbonitride (SiOCN), or combinations thereof.

In an implementation, as illustrated in FIG. 3, the spacer layer 130 may be a single layer. In an implementation, the spacer layer 130 may include a plurality of films, and at least one of films included in the spacer layer 130 may include a low-dielectric material, e.g., silicon oxycarbonitride (SiOCN).

Figure 4:
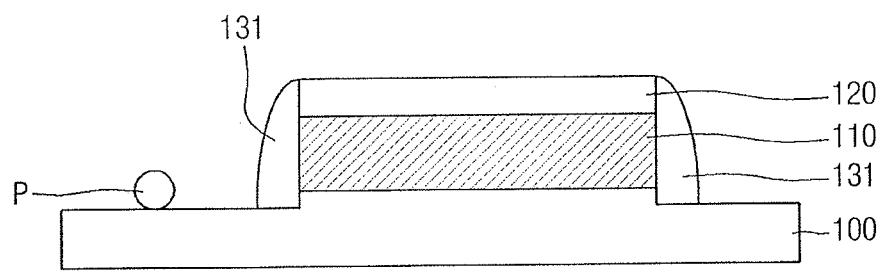

Next, referring to FIG. 4, a spacer 131 may be formed on side walls of the metal resistance pattern 110 and the mask pattern 120.

For example, the spacer 131 may be formed by etching the spacer layer 130 through an etch back process. In an implementation, when the spacer 131 includes the plurality of films, at least one film of the films included in the spacer 131 may have an L-lettered shape or an I-lettered shape. In an implementation, the top of the spacer 131 may be rounded.

In an implementation, as illustrated in FIG. 4, the spacer 131 may completely cover the side wall of the mask pattern 120. In an implementation, the spacer 131 may cover only a part of the mask pattern 120 or may not cover the mask pattern 120 at all. In an implementation, the spacer 131 may completely cover the side wall of the metal resistance pattern 110.

Figure 5:
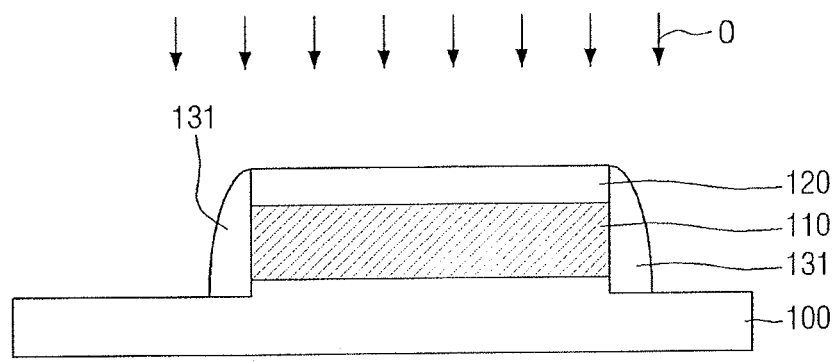

Next, referring to FIG. 5, a residue removing process O of removing the metal residue P from the insulation layer 100 may be performed.

The residue removing process O may be performed by using an etch solution having high etch selectivity for the metal. As a result, any metal residue P that remained on the insulation layer 100 may be removed, and the metal resistance pattern 110 may not be damaged.

If the metal resistance pattern 110 were to be damaged, electric reliability of the semiconductor device could be reduced. According to the example embodiments, the metal resistance pattern 110 may be blocked from an external contact through the mask pattern 120 on the upper surface of the metal resistance pattern 110 and the spacer 131 on the side wall of the metal resistance pattern 110. Accordingly, the metal resistance pattern 110 may not be damaged by the residue removing process O for removing the metal residue P.

For example, the semiconductor device according to the example embodiments may include the metal resistance pattern 110 including the spacer 131 on the side wall thereof, in an effort to help improve the electric reliability of the semiconductor device.

Figure 6:
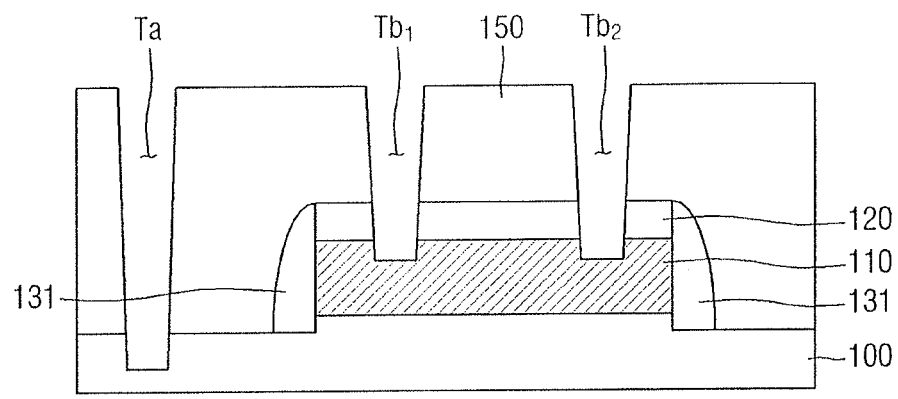

Next, referring to FIG. 6, an interlayer insulation film 150 covering the insulation layer 100 and the spacer 131 may be formed.

The interlayer insulation film 150 may be responsible for electric insulation between semiconductor devices below the interlayer insulation film 150 and the semiconductor device on the interlayer insulation film 150. In an implementation, the interlayer insulation film 150 may be formed by using a silicon oxide, e.g., borosilicate glass (BSG), phosphosilicate glass (PSG), borophosphosilicate glass (BPSG), undoped silicate glass (USG), tetraethylorthosilicate glass (TEOS), or high density plasma-CVD (HDP-CVD).

The interlayer insulation film 150 may be formed, and a gate contact trench Ta, a first resistance pattern contact trench Tb1, and second resistance pattern contact trench Tb2 may be formed. For example, the gate contact trench Ta may be formed on an area spaced apart from the spacer 131. In an implementation, the gate contact trench Ta may be formed in or extend into the insulation layer 100.

For example, the gate contact trench Ta may pass through or into the insulation layer 100. In an implementation, the gate contact trench Ta may be formed or extend into the insulation layer 100. In an implementation, in a subsequent process, the depth of the gate contact trench Ta may be determined according to an extending length of the gate contact disposed in the gate contact trench Ta.

In an implementation, a region exposed through the gate contact trench Ta may not be the insulation layer 100 region, and may be a source or drain region of the transistor. In an implementation, when the gate contact trench Ta passes through or into the insulation layer 100, the source or drain region of the transistor may be below the insulation layer 100, e.g., the insulation layer 100 may be between the source or drain region and the interlayer insulation film 150. In an implementation, when the gate contact trench Ta exposes the insulation layer 100, the exposed region may be the source or drain region of the transistor in the insulation layer region.

In an implementation, the gate contact trench Ta may have a tapered shape. For example, the gate contact trench Ta may have a trapezoidal or inverted trapezoidal shape. In an implementation, the gate contact trench Ta may have a rectangular shape.

In an implementation, the first resistance pattern contact trench Tb1 and the second resistance pattern contact trench Tb2 may expose the metal resistance pattern 110. In an implementation, each of the first resistance pattern contact trench Tb1 and the second resistance pattern contact trench Tb2 may extend into the metal resistance pattern 110.

For example, the first resistance pattern contact trench Tb1 and the second resistance pattern contact trench Tb2 may be at least partially in the metal resistance pattern 110. Accordingly, in a subsequent process, the depth of the gate contact trench Ta may be determined according to the extended lengths of the first and second resistance pattern contacts that are disposed in the first resistance pattern contact trench Tb1 and the second resistance pattern contact trench Tb2, respectively.

In an implementation, the first resistance pattern contact trench Tb1 and the second resistance pattern contact trench Tb2 may have different depths, respectively. In an implementation, as illustrated in FIG. 6, two trenches may expose the metal resistance pattern 110. In an implementation, a number of trenches exposing the metal resistance pattern 110 may be freely determined according to a need and a purpose of the device.

In an implementation, the first resistance pattern contact trench Tb1 and the second resistance pattern contact trench Tb2 may have a tapered shape, respectively. The first resistance pattern contact trench Tb1 and the second resistance pattern contact trench Tb2 may have a trapezoidal or inverted trapezoidal shape, respectively. In an implementation, the first resistance pattern contact trench Tb1 and the second resistance pattern contact trench Tb2 may have a rectangular shape, respectively.

Subsequently, referring to FIG. 7, a gate contact 141 and first and second pattern contacts 142 and 143 may be formed.

The gate contact 141 may include a barrier metal 141b and a conductive layer 141a. The first pattern contact 142 may include a first barrier metal 142b and a first conductive layer 142a. The second pattern contact 143 may include a second barrier metal 143b and a second conductive layer 143a.

The first barrier metal 142b and the second barrier metal 143b may be formed substantially the same as the barrier metal 141b. The first conductive layer 142a and the second conductive layer 143a may be formed substantially the same as the conductive layer 141a.

In an implementation, the gate contact 141 may be conformally formed in the gate contact trench Ta. For example, the barrier metal 141b may be formed on both sides and a lower surface of the gate contact trench Ta with a predetermined thickness. In an implementation, the barrier metal 141b may be formed on only the lower surfaces of the gate contact trench Ta with a predetermined thickness. In an implementation, the barrier metal 141b may include, e.g., titanium (Ti), titanium nitride (TiN), or tungsten nitride (WN). In an implementation, the barrier metal 141b may be formed by using, e.g., a PVD, CVD, or ILD method.

The conductive layer 141a may be formed on the barrier metal 141b. The conductive layer 141a may be formed to completely embed the inside of the gate contact trench Ta. An upper surface of the conductive layer 141a may be on a same plane as an upper surface of the barrier metal 141b, e.g., may be coplanar with the upper surface of the barrier metal 141b. In an implementation, the conductive layer 141a may be electrically connected with a source or a drain of the transistor. In an implementation, the conductive layer 141a may include, e.g., tungsten W. In an implementation, the conductive layer 141a may include, e.g., polysilicon, a metal silicide compound, conductive metal nitride, or elemental metal.

In an implementation, the first resistance pattern contact 142 and the second resistance pattern contact 143 may be conformally formed on the inner surfaces of the first resistance pattern contact trench Tb1 and the second resistance pattern contact trench Tb2, respectively. For example, the first barrier metal 142b and the second barrier metal 143b may be formed on both sides and the lower surfaces of the first resistance pattern contact trench Tb1 and the second resistance pattern contact trench Tb2 with predetermined thicknesses, respectively. In an implementation, the first barrier metal 142b and the second barrier metal 143b may be formed on only the lower surfaces of the first resistance pattern contact trench Tb1 and the second resistance pattern contact trench Tb2 with predetermined thicknesses, respectively. In an implementation, the first barrier metal 142b and the second barrier metal 143b may each include, e.g., titanium (Ti), titanium nitride (TiN), or tungsten nitride (WN). In an implementation, the first barrier metal 142b and the second barrier metal 143b may be formed by using, e.g., a PVD, CVD, or ILD method.

The first conductive layer 142a and the second conductive layer 143a may be formed on the first barrier metal 142b and the second barrier metal 143b, respectively. The first conductive layer 142a and the second conductive layer 143a may be formed to completely fill the insides of the first resistance pattern contact trench Tb1 and the second resistance pattern contact trench Tb2, respectively. The upper surfaces of the first conductive layer 142a and the second conductive layer 143a may be formed on the same plane as the upper surfaces of the first barrier metal 142b and the second barrier metal 143b, respectively, e.g., may be coplanar with the upper surfaces of the first barrier metal 142b and the second barrier metal 143b. In an implementation, the first conductive layer 142a and the second conductive layer 143a may each include, e.g., tungsten W. In an implementation, the conductive layer 141a may include, e.g., polysilicon, a metal silicide compound, conductive metal nitride, or elemental metal.

Figure 7:
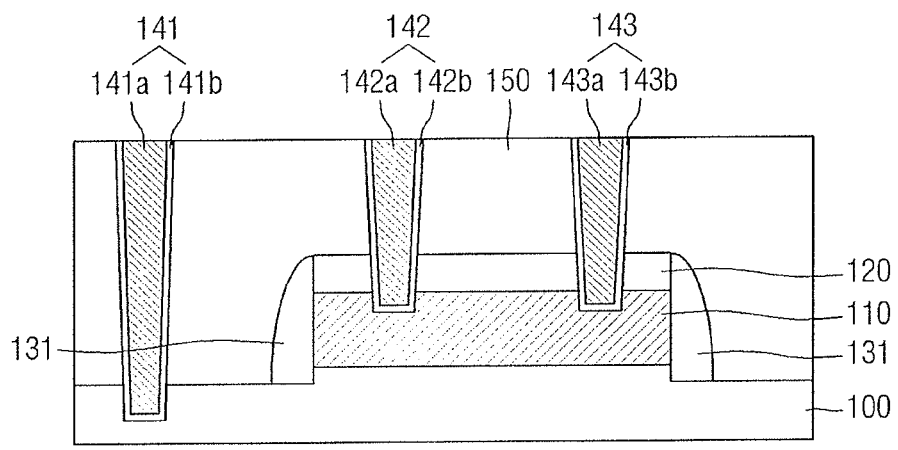

Through the aforementioned process, the semiconductor device of FIG. 7 may be manufactured. The semiconductor device according to the exemplary embodiment may include a spacer 131 covering the side wall of the metal resistance pattern 110. Accordingly, as described above, the residual removing process O of removing the metal residue P on the insulation layer 100 is performed to help prevent the damage to the metal resistance pattern 110. Accordingly, reliability of the semiconductor device according to the exemplary embodiment may be improved.

Next, a method of manufacturing a semiconductor device according to some example embodiments and a semiconductor device manufactured through the method will be described with reference to FIGS. 8 to 13.

FIGS. 8 to 13 illustrate cross-sectional views of stages in a method of manufacturing a semiconductor device and a semiconductor device according to some example embodiments.

The semiconductor device according to the exemplary embodiment of the example embodiments is substantially the same as the manufacturing method of the semiconductor device and the semiconductor device described through FIGS. 1 to 7 except that a projection may be formed on the insulation layer.

Accordingly, like reference numerals designate like constituent elements, and thus, the duplicated description for like constituent elements may be omitted and differences will be mainly described.

Figure 8:
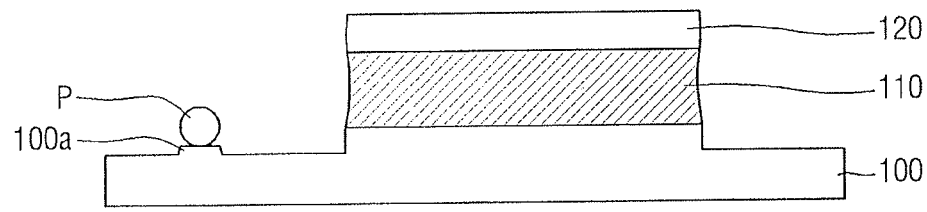
FIGS. 8 to 13 illustrate cross-sectional views of stages in a method of manufacturing a semiconductor device and a semiconductor device according to some example embodiments.

Referring to FIG. 8, when the metal resistance pattern 110 is formed, a projection 100*a* may be formed on the insulation layer 100.

Figure 10:
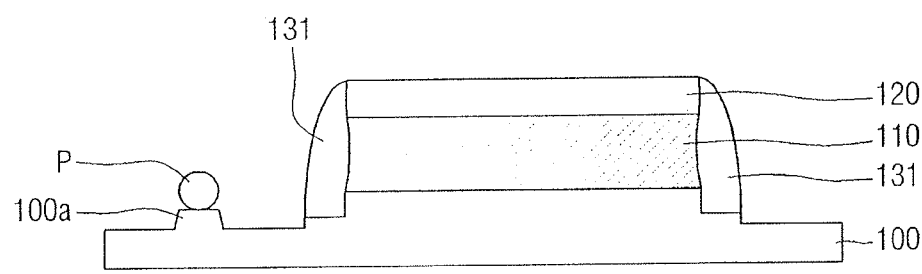

In an implementation, the projection 100*a* may be formed in an intermediate step described through FIG. 8 or formed in the intermediate step described through FIG. 10. In an implementation, when the projection 100*a* is formed in the intermediate step described through FIG. 8, the size may be increased in the intermediate step described through FIG. 10. In the present exemplary embodiment, it is described by assuming that the projection 100*a* is formed in the intermediate step described through FIG. 10 and the size is increased in the intermediate step described through FIG. 10.

In the case of the insulation layer 100 without forming the mask pattern 120 on the upper surface when the metal resistance pattern 110 is formed, a part of the upper surface of the insulation layer 100 could be removed as illustrated in the drawing. However, when the metal residue P remains on the insulation layer 100, the insulation layer 100 below the metal residue P may not be removed. As a result, as illustrated in the drawing, the projection 100*a* may be formed. For example, an area of the upper surface of the projection 100*a* may be determined by the size of the metal residue P on the upper surface of the projection 110*a*.

In an implementation, the number of projections 100*a* may depend on the number of metal residues P.

In an implementation, the side wall of the metal resistance pattern 110 may have a curved shape (as illustrated in the drawing) when the metal resistance pattern 110 is formed.

Figure 9:
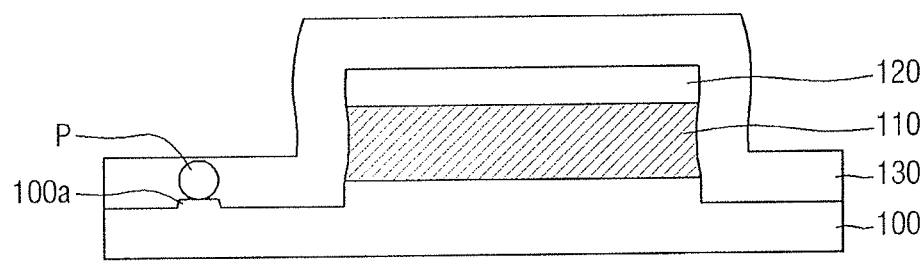

Referring to FIG. 9, a spacer layer 130 that covers the insulation layer 100, the metal resistance pattern 110, the mask pattern 120, and the metal residues P may be formed.

The forming of the spacer layer 130 may include forming the spacer layer 130 conformally by performing a deposition process on the surface of the insulation layer 100, the metal resistance pattern 110, the mask pattern 120, and the metal residues P.

In an implementation, the spacer layer 130 may be formed along the metal resistance pattern 110 having a curved side wall, and the spacer layer 130 on the side wall of the metal resistance pattern 110 may also have a curved shape, as illustrated in the drawing.

Next, referring to FIG. 10, a spacer 131 may be formed on side walls of the metal resistance pattern 110 and the mask pattern 120.

When the spacer 131 is formed, the height of the projection 100*a* may be increased. For example, as compared with the height of the projection 100*a* in the intermediate step of FIG. 9 above, the height of the projection 100*a* in the intermediate step of FIG. 10 may be increased.

Figure 11:
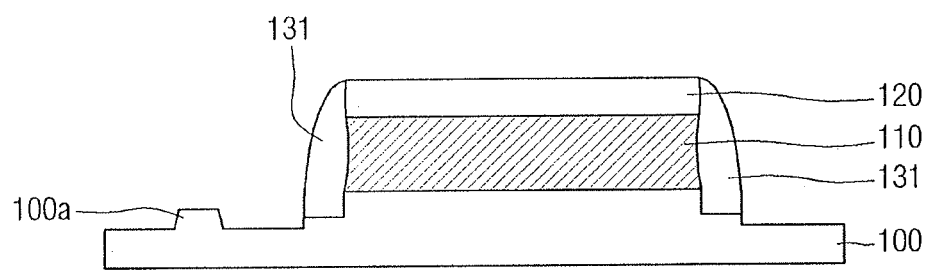

Next, referring to FIG. 11, the residue removing process O of removing the metal residue P from the insulation layer 100 may be performed.

Through the residue removing process O, the upper surface of the projection 100*a* may be exposed.

The residue removing process O may be performed by using an etch solution having high etch selectivity for the metal. As a result, the metal residue P that remained on the insulation layer 100 may be removed, and the metal resistance pattern 110 may not be damaged.

If the metal resistance pattern 110 were to be damaged, electric reliability of the semiconductor device could be reduced. In an implementation, the metal resistance pattern 110 may be blocked from an external contact through the mask pattern 120 on the upper surface of the metal resistance pattern 110 and the spacer 131 on the side wall of the metal resistance pattern 110. Accordingly, the metal resistance pattern 110 may not be damaged during the residue removing process O for removing the metal residue P.

Therefore, the semiconductor device according to the example embodiments may include the metal resistance pattern 110 in which the spacer 131 is disposed on the side wall to help improve the electric reliability of the semiconductor device.

Figure 12A:
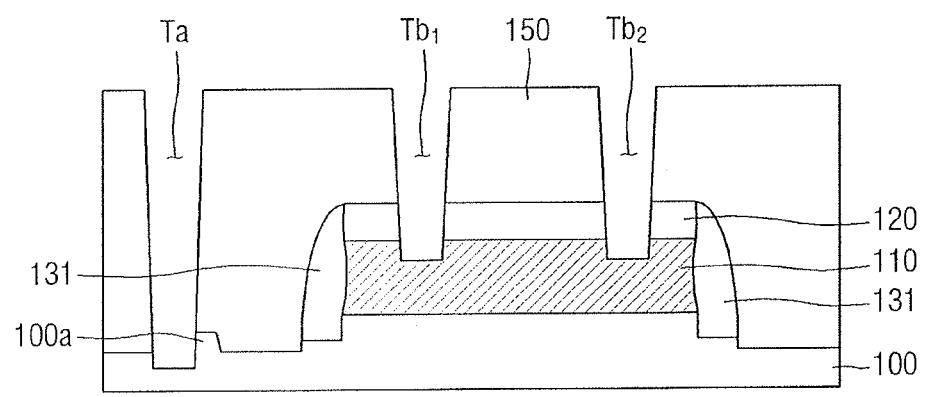

Next, referring to FIG. 12A, an interlayer insulation film 150 (covering the insulation layer 100 and the spacer 131) may be formed. Next, the interlayer insulation film 150 may be formed, and a gate contact trench Ta, a first resistance pattern contact trench Tb1, and a second resistance pattern contact trench Tb2 may be formed.

The gate contact trench Ta may be formed by removing a part of the projection 100*a*. In this case, a side wall of the projection 100*a* may be exposed through an inner side wall of the gate contact trench Ta. The projection 100*a* may cover a part of the gate contact trench Ta.

Figure 12B:
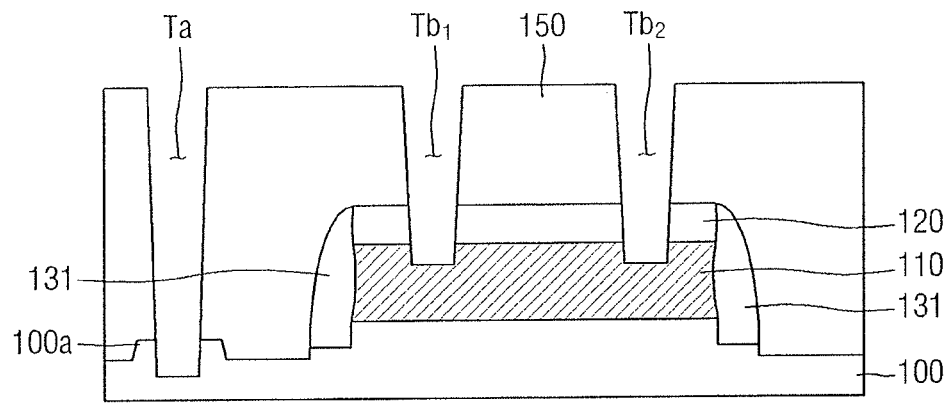

In an implementation, referring to FIG. 12B, the projection 100*a* may cover the entire gate contact trench Ta, e.g., the projection 100*a* may surround a lower end of the gate contact trench Ta. For example, when the size of the upper surface of the projection 100*a* is sufficiently large, the projection 100*a* may cover or surround the entire gate contact trench Ta.

Subsequently, referring to FIG. 13, a gate contact 141 and first and second pattern contacts 142 and 143 may be formed.

The gate contact 141 may include a barrier metal 141*b* and a conductive layer 141*a*. The first pattern contact 142 may include a first barrier metal 142*b* and a first conductive layer 142*a*. The second pattern contact 143 may include a second barrier metal 143*b* and a second conductive layer 143*a*.

Figure 13:
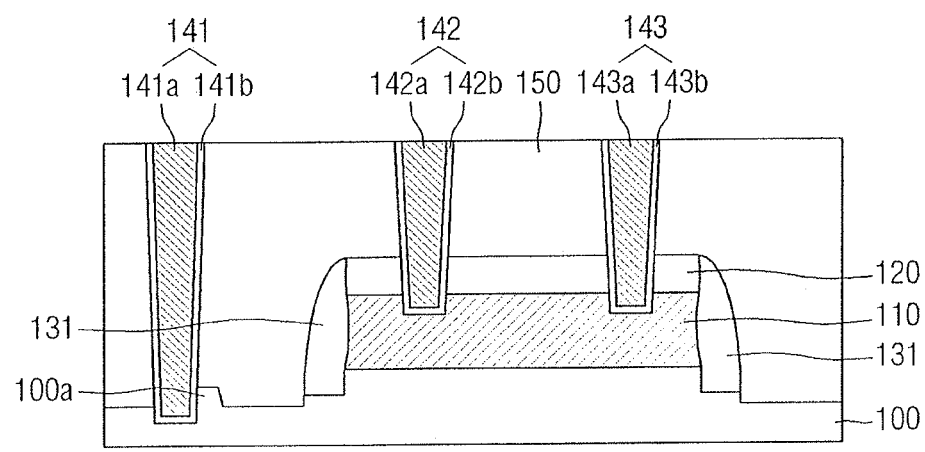

Through the aforementioned process, the semiconductor device of FIG. 13 may be manufactured. The semiconductor device according to the exemplary embodiment may include a spacer 131 covering the side wall of the metal resistance pattern 110. Accordingly, as described above, the residual removing process O of removing the metal residue P on the insulation layer 100 may be performed to help prevent the damage to the metal resistance pattern 110. Accordingly, reliability of the semiconductor device according to the exemplary embodiment may be improved.

Next, referring to FIG. 14, a semiconductor device according to some example embodiments will be described.

Figure 14:
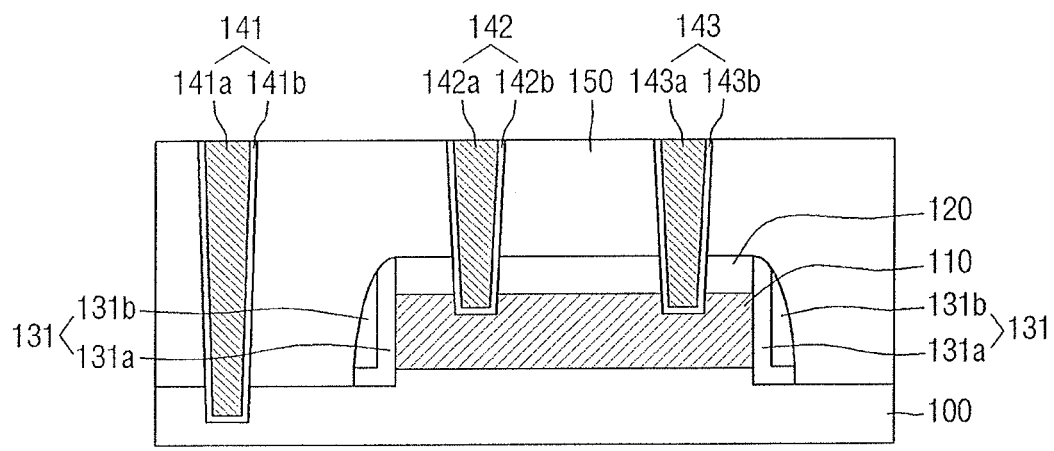
FIGS. 14 to 25 illustrate cross-sectional views of semiconductor devices according to some example embodiments.

FIG. 14 illustrates a cross-sectional view of a semiconductor device according to some example embodiments.

The semiconductor device according to the exemplary embodiment is substantially the same as the semiconductor device described in FIG. 7, except for a shape of the spacer. Accordingly, like reference numerals designate like constituent elements, and thus, the duplicated description for like constituent elements may be omitted and differences will be mainly described.

Referring to FIG. 14, a spacer 131 included in the semiconductor device according to the exemplary embodiment may include an inner spacer 131a and an outer spacer 131b. The inner spacer 131a may have, e.g., an L-lettered shape in cross section. In an implementation, the inner spacer 131a and the outer spacer 131b may include different materials. In an implementation, the outer spacer 131b may be formed of the same material as the interlayer insulation film 150.

In an implementation, the spacer 131 may be formed by first forming the inner spacer 131a that conformally covers the insulation layer 100 and the metal resistance pattern 110 and then forming the outer spacer 131b on the inner spacer 131a.

Next, referring to FIG. 15, a semiconductor device according to some example embodiments will be described.

Figure 15:
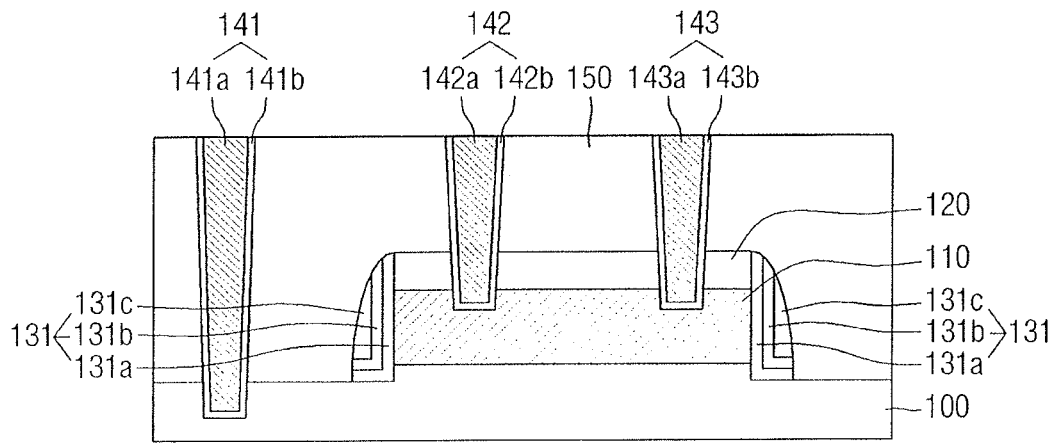

FIG. 15 illustrates a cross-sectional view of a semiconductor device according to some example embodiments.

The semiconductor device according to the exemplary embodiment is substantially the same as the semiconductor device described in FIG. 14, except for a shape of the spacer. Accordingly, like reference numerals designate like constituent elements, and thus, the duplicated description for like constituent elements may be omitted and differences will be mainly described.

Referring to FIG. 15, a spacer 131 included in the semiconductor device according to the exemplary embodiment may include a first inner spacer 131a, a second inner spacer 131b, and an outer spacer 131b. The first inner spacer 131a and the second inner spacer 131b may have an L-lettered shape in cross section, respectively. In an implementation, the first inner spacer 131a, the second inner spacer 131b, and the outer spacer 131b may include different materials, respectively. In an implementation, the outer spacer 131b may be formed of the same material as the interlayer insulation film 150.

Next, referring to FIG. 16, a semiconductor device according to some example embodiments will be described.

Figure 16:
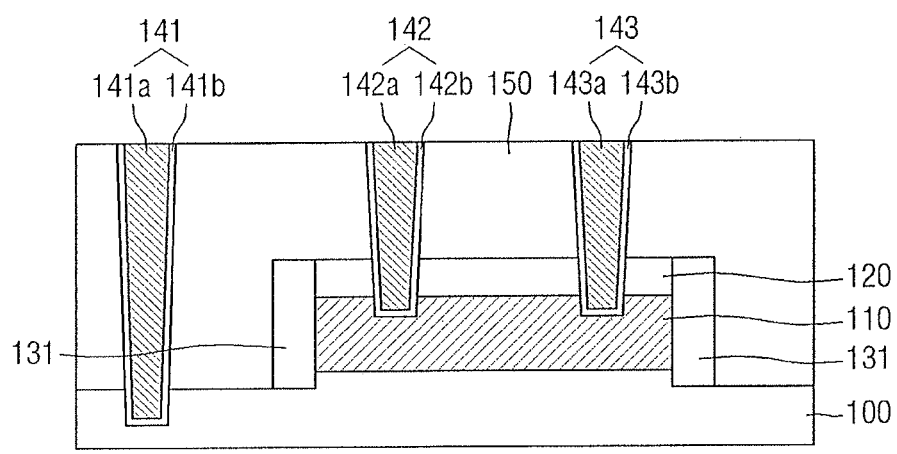

FIG. 16 illustrates a cross-sectional view of a semiconductor device according to some example embodiments.

The semiconductor device according to the exemplary embodiment is substantially the same as the semiconductor device described in FIG. 7, except for a shape of the spacer. Accordingly, like reference numerals designate like constituent elements, and thus, the duplicated description for like constituent elements may be omitted and differences will be mainly described.

Referring to FIG. 16, a spacer 131 included in the semiconductor device according to the exemplary embodiment may be an l-lettered spacer in cross section, e.g., may have a straight line or bar shape in cross section. In an implementation, the spacer 131 may be a single layer or the spacer 131 may be formed in a multilayered structure like the exemplary embodiment of FIG. 15.

Next, referring to FIG. 17, a semiconductor device according to some example embodiments will be described.

Figure 17:
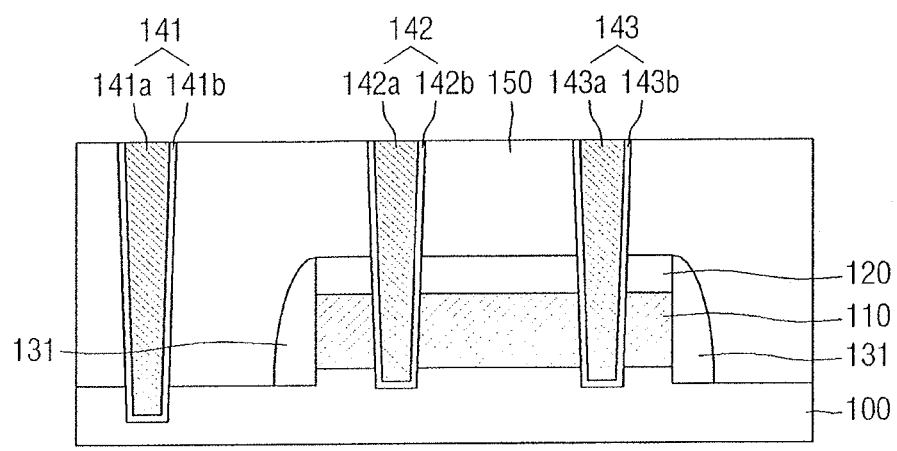

FIG. 17 illustrates a cross-sectional view of a semiconductor device according to some example embodiments.

The semiconductor device according to the exemplary embodiment is substantially the same as the semiconductor device described in FIG. 7, except for an extended depth of the resistance pattern contact. Accordingly, like reference numerals designate like constituent elements, and thus, the duplicated description for like constituent elements may be omitted and differences will be mainly described.

Referring to FIG. 17, a first resistance pattern contact 142 and a second resistance pattern contact 143 may pass through a metal resistance pattern 110.

In an implementation, both the first resistance pattern contact 142 and the second resistance pattern contact 143 may pass through the metal resistance pattern 110. In an implementation, only one of the first resistance pattern contact 142 and the second resistance pattern contact 143 may pass through the metal resistance pattern 110.

In an implementation, a resistance pattern contact of at least one of the first resistance pattern contact 142 and the second resistance pattern contact 143 may pass through the metal resistance pattern 110, and the resistance pattern contact of at least one of the first resistance pattern contact 142 and the second resistance pattern contact 143 may be in contact with the metal resistance pattern 110 only on side walls of the at least one of the first resistance pattern contact 142 and the second resistance pattern contact 143.

Next, referring to FIG. 18, a semiconductor device according to some example embodiments will be described.

Figure 18:
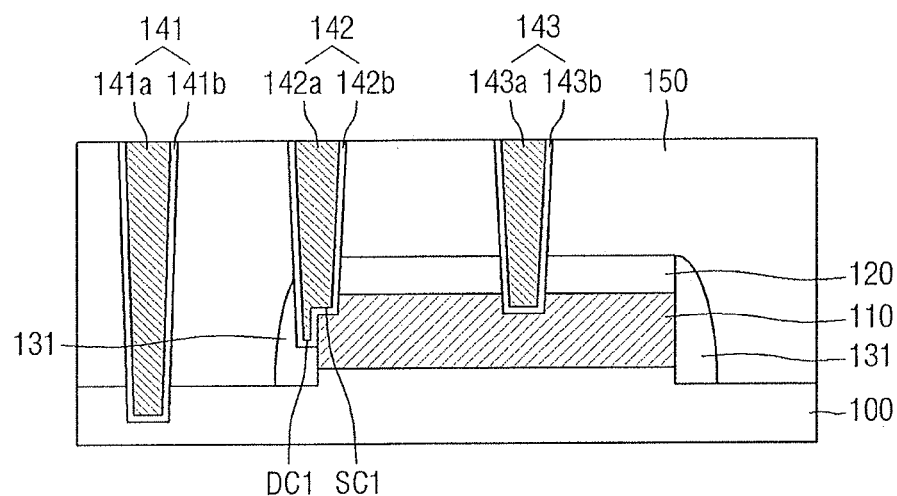

FIG. 18 illustrates a cross-sectional view of a semiconductor device according to some example embodiments.

The semiconductor device according to the exemplary embodiment is substantially the same as the semiconductor device described in FIG. 7, except for an extended depth of the resistance pattern contact. Accordingly, like reference numerals designate like constituent elements, and thus, the duplicated description for like constituent elements may be omitted and differences will be mainly described.

Referring to FIG. 18, the first resistance pattern contact 142 may have a first lower surface DC1 and a second lower surface SC1.

The first lower surface DC1 and the second lower surface SC1 may be formed by a multi-stage structure as illustrated in the drawing and may not be disposed on the same plane, e.g., may be disposed on different planes. In an implementation, the first lower surface DC1 may be parallel with the second lower surface SC1 while being on different planes.

In the exemplary embodiment, the first resistance pattern contact 142 may be formed through the spacer 131 and the mask pattern 120, unlike the first resistance pattern contact 142 of the semiconductor device described in FIG. 7.

For forming the first resistance pattern contact 142, when forming the first resistance pattern contact trench Tb1, degrees that the spacer 131 and the metal resistance pattern 110 are recessed may be different from each other. Accordingly, the first resistance pattern contact 142 may have the first lower surface DC1 and the second lower surface SC1 with different depths.

The first lower surface DC1 may be in the spacer 131 to contact the spacer 131, and the second lower surface SC1 may contact the metal resistance pattern 110. Accordingly, the first lower surface DC1 may be closer to the insulation layer 100 than the second lower surface SC1 is to the insulation layer 100.

Next, referring to FIG. 19, a semiconductor device according to some example embodiments will be described.

Figure 19:
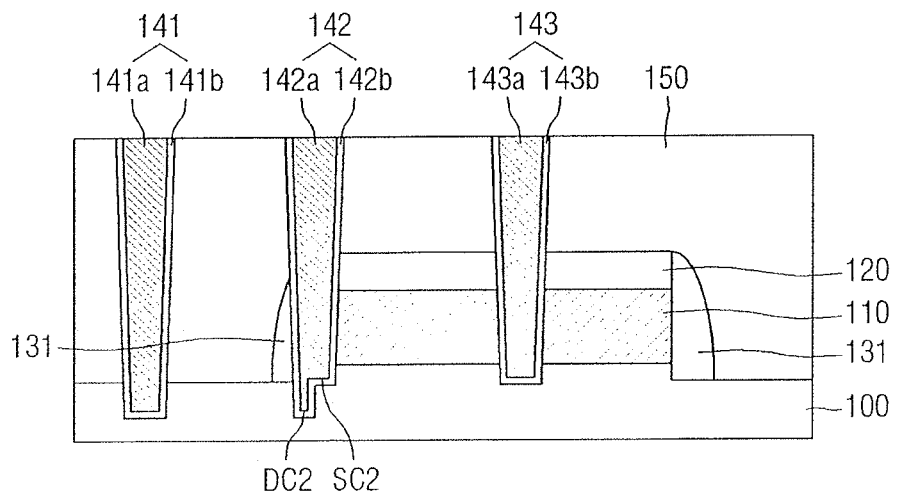

FIG. 19 illustrates a cross-sectional view of a semiconductor device according to some example embodiments.

The semiconductor device according to the exemplary embodiment is substantially the same as the semiconductor device described in FIG. 18, except for an extended depth of the resistance pattern contact. Accordingly, like reference numerals designate like constituent elements, and thus, the duplicated description for like constituent elements may be omitted and differences will be mainly described.

In the exemplary embodiment, the first resistance pattern contact 142 may pass through the metal resistance pattern 110, unlike the first resistance pattern contact 142 of the semiconductor device described in FIG. 18.

For forming the first resistance pattern contact 142, when forming the first resistance pattern contact trench Tb1, degrees that the spacer 131 and the metal resistance pattern 110 are recessed may be different from each other. Accordingly, the first resistance pattern contact 142 may have a first lower surface DC1 and a second lower surface SC1 with different depths.

Next, referring to FIG. 20, a semiconductor device according to some example embodiments will be described.

Figure 20:
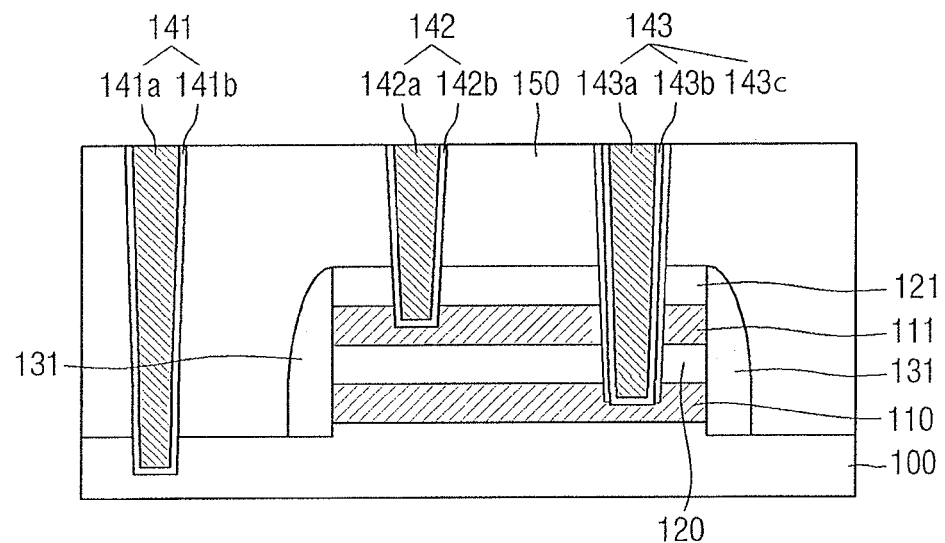

FIG. 20 illustrates a cross-sectional view of a semiconductor device according to some example embodiments.

The semiconductor device according to the exemplary embodiment is substantially the same as the semiconductor device described in FIG. 7, except that the semiconductor device may include a plurality of metal resistance patterns and the first and second resistance pattern may respectively contact different metal resistance patterns. Accordingly, like reference numerals designate like constituent elements, and thus, the duplicated description for like constituent elements may be omitted and differences will be mainly described.

Referring to FIG. 20, on the insulation layer 100, a first metal resistance pattern 110, a first mask pattern 120, a second metal resistance pattern 111, and a second mask pattern 121 may be disposed, and a spacer 131 may be disposed on side walls of the first metal resistance pattern 110, the first mask pattern 120, the second metal resistance pattern 111, and the second mask pattern 121.

Further, a first resistance pattern contact 142 may contact the second metal resistance pattern 111 and a second resistance pattern contact 143 may contact the first metal resistance pattern 110. For example, the first resistance pattern contact 142 may physically contact the second metal resistance pattern 111 by passing through the second mask pattern 121, and the second resistance pattern contact 143 may contact the first metal resistance pattern 110 by passing through the second mask pattern 121, the second metal resistance pattern 111, and the first mask pattern 120.

In an implementation, the second pattern contact 143 may include a second contact insulation layer 143c on the second barrier metal 143b. Electric connection between the second pattern contact 143 and the second metal resistance pattern may be blocked through the second contact insulation layer 143c.

In an implementation, the second contact insulation layer 143c may entirely cover the side wall of the second barrier metal 143b or the second contact insulation layer 143c may be formed only between the second pattern contact 143 and the second metal resistance pattern.

In an implementation, the first resistance pattern contact 142 and the second pattern contact 143 may be formed of a same material. In an implementation, the first resistance pattern contact 142 and the second pattern contact 143 may be formed of different materials. In an implementation, the first metal resistance pattern 110 and the second metal resistance pattern 111 may be formed of a same material. In an implementation, the first metal resistance pattern 110 and the second metal resistance pattern 111 may be formed of different.

Next, referring to FIG. 21, a semiconductor device according to some example embodiments will be described.

Figure 21:
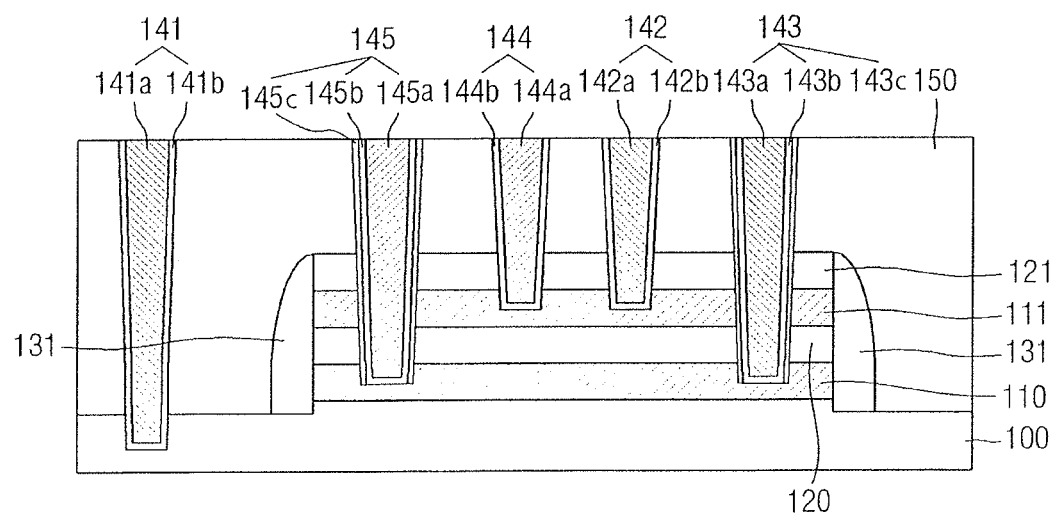

FIG. 21 illustrates a cross-sectional view of a semiconductor device according to some example embodiments.

The semiconductor device according to the exemplary embodiment is substantially the same as the semiconductor device described in FIG. 20, except that a plurality of first and second resistance pattern contacts is included. Accordingly, like reference numerals designate like constituent elements, and thus, the duplicated description for like constituent elements may be omitted and differences will be mainly described.

Referring to FIG. 21, on the insulation layer 100, a first metal resistance pattern 110, a first mask pattern 120, a second metal resistance pattern 111, and a second mask pattern 121 may be disposed, and a spacer 131 may be disposed on the side walls of the first metal resistance pattern 110, the first mask pattern 120, the second metal resistance pattern 111, and the second mask pattern 121.

In an implementation, a first resistance pattern contact 142 and a third resistance pattern contact 144 (which contact the second metal resistance pattern 111) may be included. In an implementation, a second resistance pattern contact 143 and a fourth resistance pattern contact 145 (which contact the first metal resistance pattern 110) may be included.

The third resistance pattern contact 144 may be substantially the same as the first resistance pattern contact 142 and may include a third barrier metal 144b and a third conductive layer 144a.

The fourth resistance pattern contact 145 may be substantially the same as the second resistance pattern contact 143 and may include a fourth barrier metal 145b, a fourth conductive layer 145a, and a fourth contact insulation layer 145c.

In an implementation, the second resistance pattern contact 143 and the fourth resistance pattern contact 145 may be relatively arranged on the inner side, and the first resistance pattern contact 142 and the third resistance pattern contact 144 may be relatively arranged on the outer side. In an implementation, the arrangement of the first to fourth resistance pattern contacts 142, 144, 143, and 145 may be varied as desired.

Next, referring to FIG. 22, a semiconductor device according to some example embodiments will be described.

Figure 22:
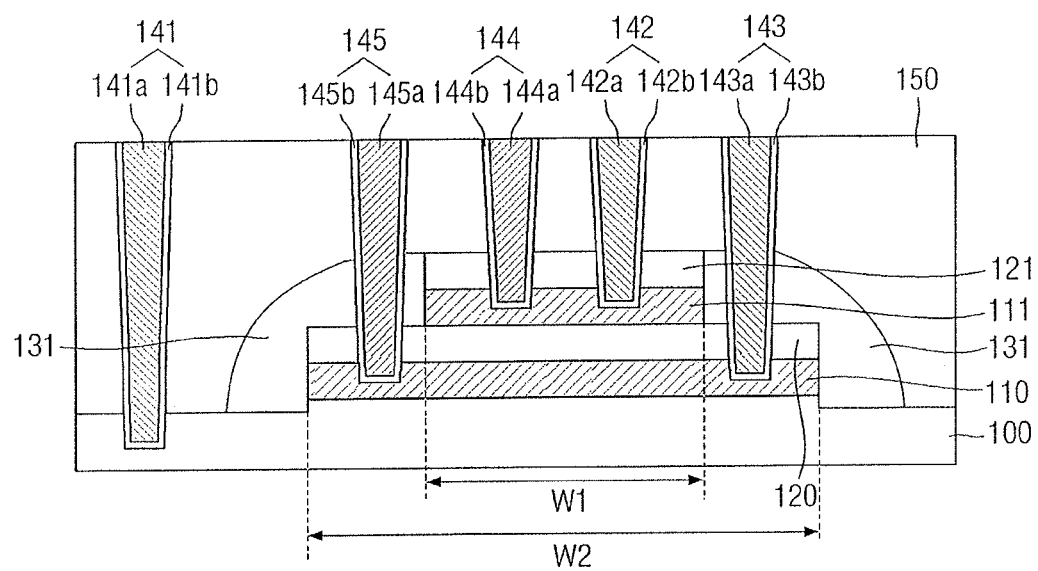

FIG. 22 illustrates a cross-sectional view of a semiconductor device according to some example embodiments.

The semiconductor device according to the exemplary embodiment is substantially the same as the semiconductor device described in FIG. 21, except that widths of the second mask pattern and the second metal resistance pattern may be different from widths of the first mask pattern and the first metal resistance pattern. Accordingly, like reference numerals designate like constituent elements, and thus, the duplicated description for like constituent elements may be omitted and differences will be mainly described.

Referring to FIG. 20, on the insulation layer 100, a first metal resistance pattern 110, a first mask pattern 120, a second metal resistance pattern 111, and a second mask pattern 121 may be disposed, and a spacer 131 may be disposed on the side walls of the first metal resistance pattern 110, the first mask pattern 120, the second metal resistance pattern 111, and the second mask pattern 121.

In an implementation, a width W2 of the first metal resistance pattern 110 may be larger than a width W1 of the second metal resistance pattern 111. A width W2 of the first mask pattern 120 may be larger than a width W2 of the second mask pattern 121. For example, the second metal resistance pattern 111 and the second mask pattern 121 may be arranged in inner regions of the first metal resistance pattern 110 and the first mask pattern 120.

In an implementation, the second metal resistance pattern 111 and the second mask pattern 121 may have the same width W1 or the second metal resistance pattern 111 and the second mask pattern 121 may have different widths. In an implementation, the first metal resistance pattern 110 and the first mask pattern 120 may have the same width W1 or the first metal resistance pattern 110 and the first mask pattern 120 may have different widths.

In an implementation, the second resistance pattern contact 143 and the fourth resistance pattern contact 145 may contact the first metal resistance pattern 110 by passing through the spacer 131 and the first mask pattern 120. Accordingly, the second resistance pattern contact 143 and the fourth resistance pattern contact 145 may not include a contact insulation layer for preventing electric connection with the second metal resistance pattern 111.

Next, referring to FIG. 23, a semiconductor device according to some example embodiments will be described.

Figure 23:
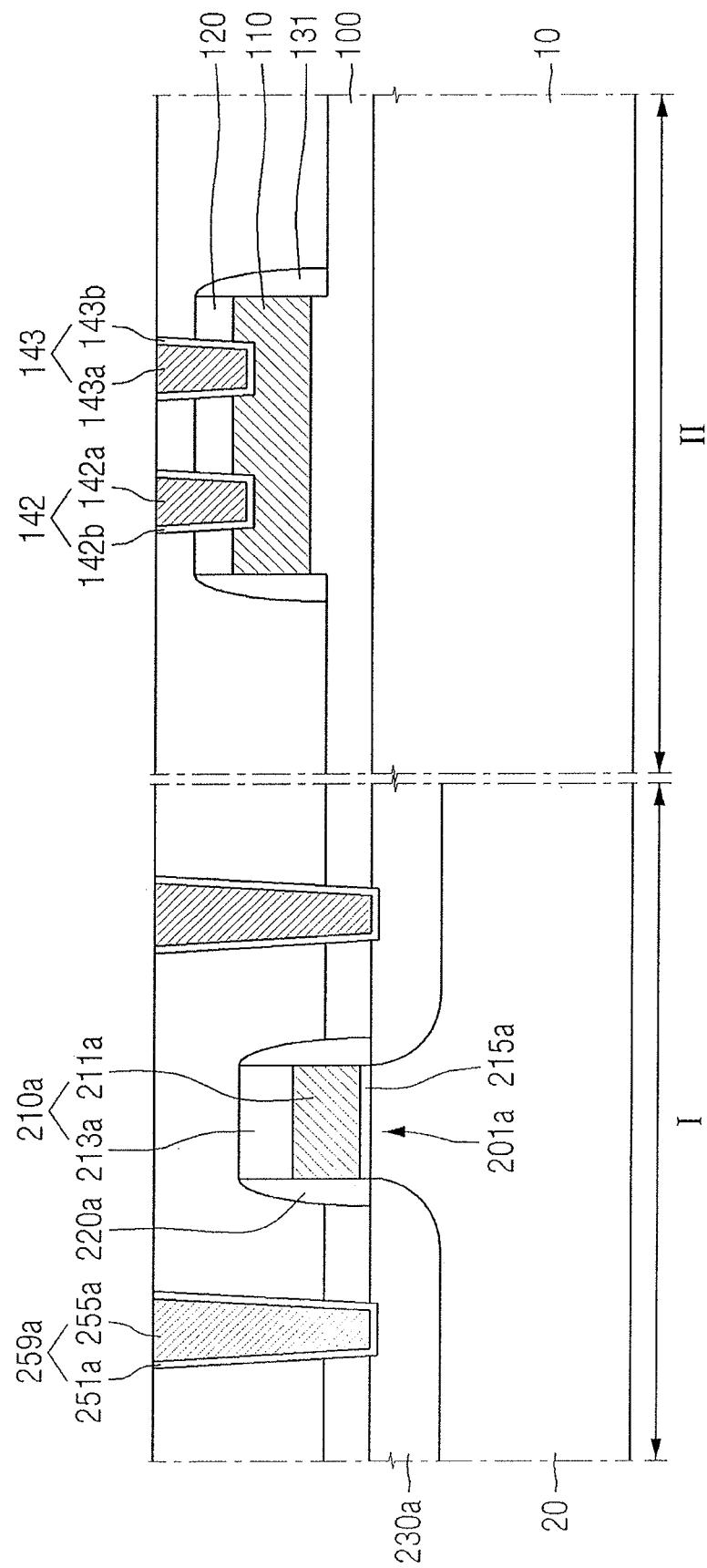

FIG. 23 is a cross-sectional view for describing a semiconductor device according to some example embodiments.

The semiconductor device according to the exemplary embodiment is substantially the same as the semiconductor devices according to the aforementioned example embodiments, except that the semiconductor device according to the aforementioned example embodiments is disposed in a second region and a semiconductor device including a gate structure is disposed in a first region. Accordingly, like reference numerals designate like constituent elements, and thus, the duplicated description for like constituent elements may be omitted and differences will be mainly described.

Referring to FIG. 23, the semiconductor device according to the exemplary embodiment may include substrates 10 and 20, a gate contact 259a, a gate structure 210a, and source and drain regions 230a.

The substrates 10 and 20 may be, e.g., semiconductor substrates. In an implementation, the substrates 10 and 20 may include, e.g., silicon, strained silicon (strained Si), a silicon alloy, silicon carbide (SiC), silicon germanium (SiGe), silicon germanium carbide (SiGeC), germanium, a germanium alloy, gallium arsenide (GaAs), indium arsenide (InAs), a III-V semiconductor, and a II-VI semiconductor, a combination thereof, or a laminate thereof. In an implementation, the substrates 10 and 20 may be an organic plastic substrate other than the semiconductor substrate. Hereinafter, it will be described that the substrate is made of silicon.

The substrates 10 and 20 may be a P type or an N type. In an implementation, an insulation substrate may be used as the substrates 10 and 20. In an implementation, a silicon on insulator (SOI) substrate may be used. In the case of using the SOI substrate, in an operating process of the semiconductor device according to the exemplary embodiment, a delay time may be reduced.

The substrates 10 and 20 may include a first region I and a second region II. The first region I and the second region II may be connected to each other or spaced apart from each other.

The metal resistance pattern 110 and the mask pattern 120 may be formed in the second region II of the semiconductor substrates 10 and 20, and the gate structure 210a and the source and drain 230a may be formed in the first region I of the semiconductor substrates 10 and 20.

In an implementation, a gate contact 259a in the first region I is substantially the same as the gate contact 141 included in the semiconductor devices described in FIGS. 1 to 19. Accordingly, a barrier metal 251a and a conductive layer 255a are substantially the same as the barrier metal 141b and the conductive layer 141a, respectively.

The source and drain 230a may be formed in the substrates 10 and 20 between adjacent gate structures. The source and drain 230a may be formed in a fin type active pattern. The source and drain 230a may include silicon or germanium as an element semiconductor material. In an implementation, the source and drain 230a may include a compound semiconductor, e.g., may include a IV-IV group compound semiconductor or a III-V group compound semiconductor. In an implementation, in the IV-IV group compound semiconductor, e.g., an epitaxial layer may be a binary compound and a ternary compound which include at least two of carbon (C), silicon (Si), germanium (Ge), and tin (Sn), or a compound in which the IV-group element is doped in the compounds. In the III-V group compound semiconductor, e.g., an epitaxial layer may be one of a binary compound which is formed by connecting at least one of aluminum (Al), gallium (Ga), and indium (In) as a III-group element and one of phosphorus (P), arsenic (As), and antimony (Sb), a ternary compound, or a quaternary compound. In an implementation, the source and drain 230a may be formed with an LDD structure.

The gate structure may include a gate electrode 210a, a spacer 220a, and a gate insulation film 215a.

The gate insulation film 215a may be disposed between the substrate 20 and the gate electrode 210a. The gate insulation film 215a may include a high dielectric (high-K) film. When the gate insulation film 215a is the high-K film, the gate insulation film 215a may be formed of a material having a high dielectric constant. In an implementation, as the material having a high dielectric constant, for example, $HfO_2$, $Al_2O_3$, $ZrO_2$, $TaO_2$, or the like may be included.

The gate electrode 210a may include a conductive layer 211a and a hard mask film 213a. In an implementation, the conductive layer 211a may be formed by a single conductive film 211a such as a polysilicon film, a silicide film, and a metal film, or may be a laminated form thereof. The gate electrode 210a may include the hard mask film 213a on the conductive layer 211a.

The spacer 220a may be on at least one side of the gate electrode 210a. In an implementation, the spacer 220a may be disposed at both sides of the gate electrode 210a as illustrated in FIG. 1. The spacer 220a may include a nitride film or an oxynitride film. In an implementation, as illustrated in FIG. 23, one side of the spacer 220a may be a curved line. In an implementation, the shape of the spacer 220a may be modified. For In an implementation, the shape of the spacer 220a may be modified to an I-lettered shape, an L-lettered shape, or the like.

The gate contact 259a may be formed on the source and drain 230a. The gate contact 259a may include a barrier metal 251a and a conductive layer 255a.

In an implementation, the barrier metal 251a may include, e.g., titanium (Ti), titanium nitride (TiN), or tungsten nitride (WN). In an implementation, the barrier metal 251a may be formed by using, e.g., a PVD, CVD, or ILD method. In an implementation, the conductive layer 255a may be formed on the barrier metal 251a.

In an implementation, the lower surface of the conductive layer 255a and the upper surface of the source and drain 230a may be equally illustrated, e.g., may be coplanar, or the lower surface of the conductive layer 255a may be formed to be higher or lower than the upper surface of the source and drain 230a. The upper surface of the conductive layer 255a may be disposed on a same plane as the upper surface of the barrier metal 251a. The conductive layer 255a may be electrically connected with the source and drain 230a. In an implementation, the conductive layer 255a may include, e.g., tungsten W. In an implementation, the conductive layer 141a may include, e.g., polysilicon, a metal silicide compound, conductive metal nitride, or elemental metal.

Next, referring to FIG. 24, a semiconductor device according to some example embodiments will be described.

Figure 24:
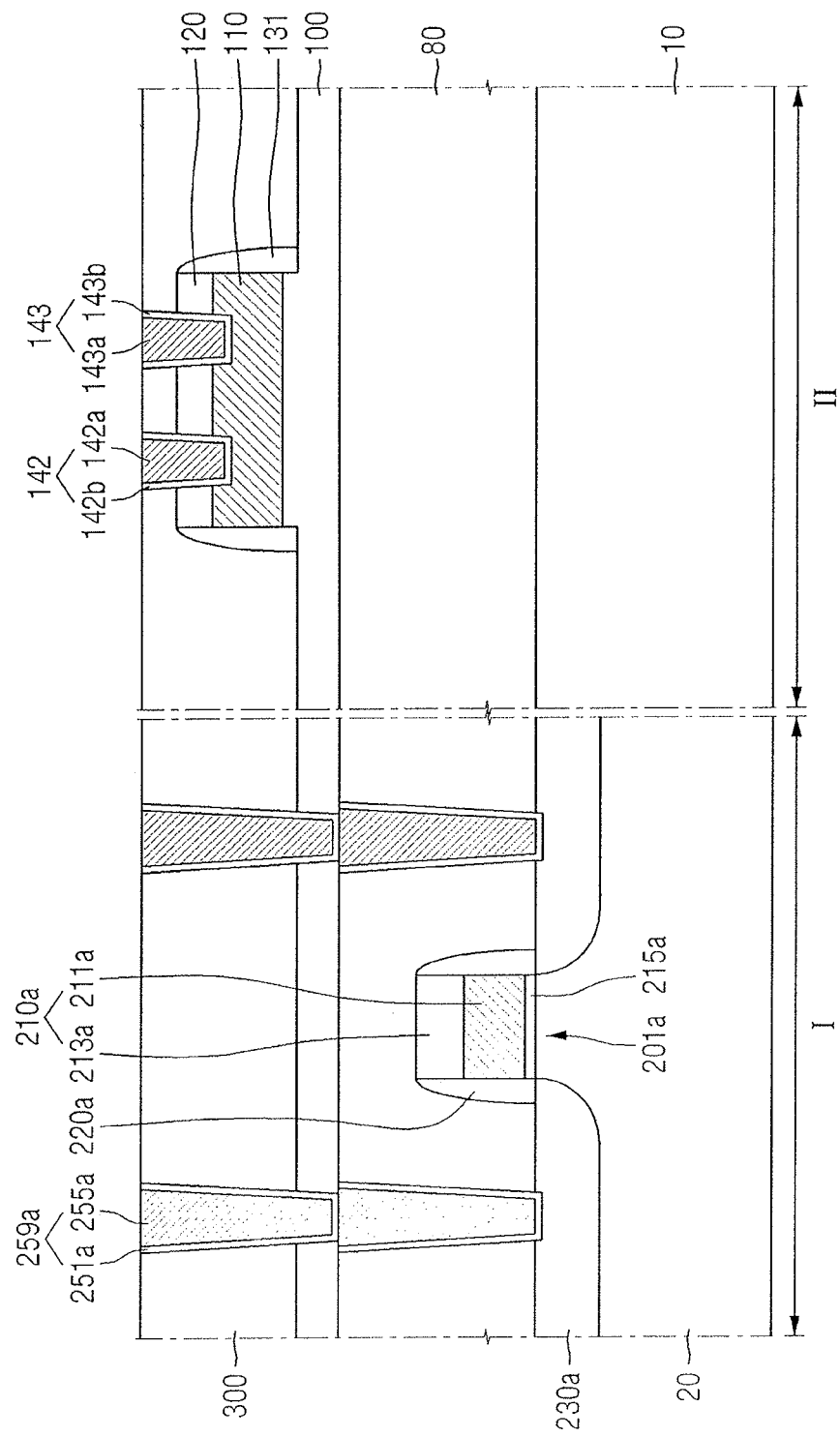

FIG. 24 illustrates a cross-sectional view of a semiconductor device according to some example embodiments.

The semiconductor device according to the exemplary embodiment is substantially the same as the semiconductor device described in FIG. 23, except that the gate structure and the metal resistance pattern may not be disposed on the same plane. Accordingly, like reference numerals designate like constituent elements, and thus, the duplicated description for like constituent elements may be omitted and differences will be mainly described.

In the semiconductor device according to the exemplary embodiment, as compared with the semiconductor device described in FIG. 23, a second interlayer insulation film 300 may be further disposed on the interlayer insulation layer 150.

Accordingly, the gate contact 259a in the first region I may have a structure in which two gate contacts 259a are connected to each other in series. In the second region II, an additional insulation layer 80 may be between the substrate 10 and the insulation layer 100. In an implementation, the gate structure and the like may be disposed in the additional insulation layer 80.

Next, referring to FIG. 25, a semiconductor device according to some example embodiments will be described.

Figure 25:
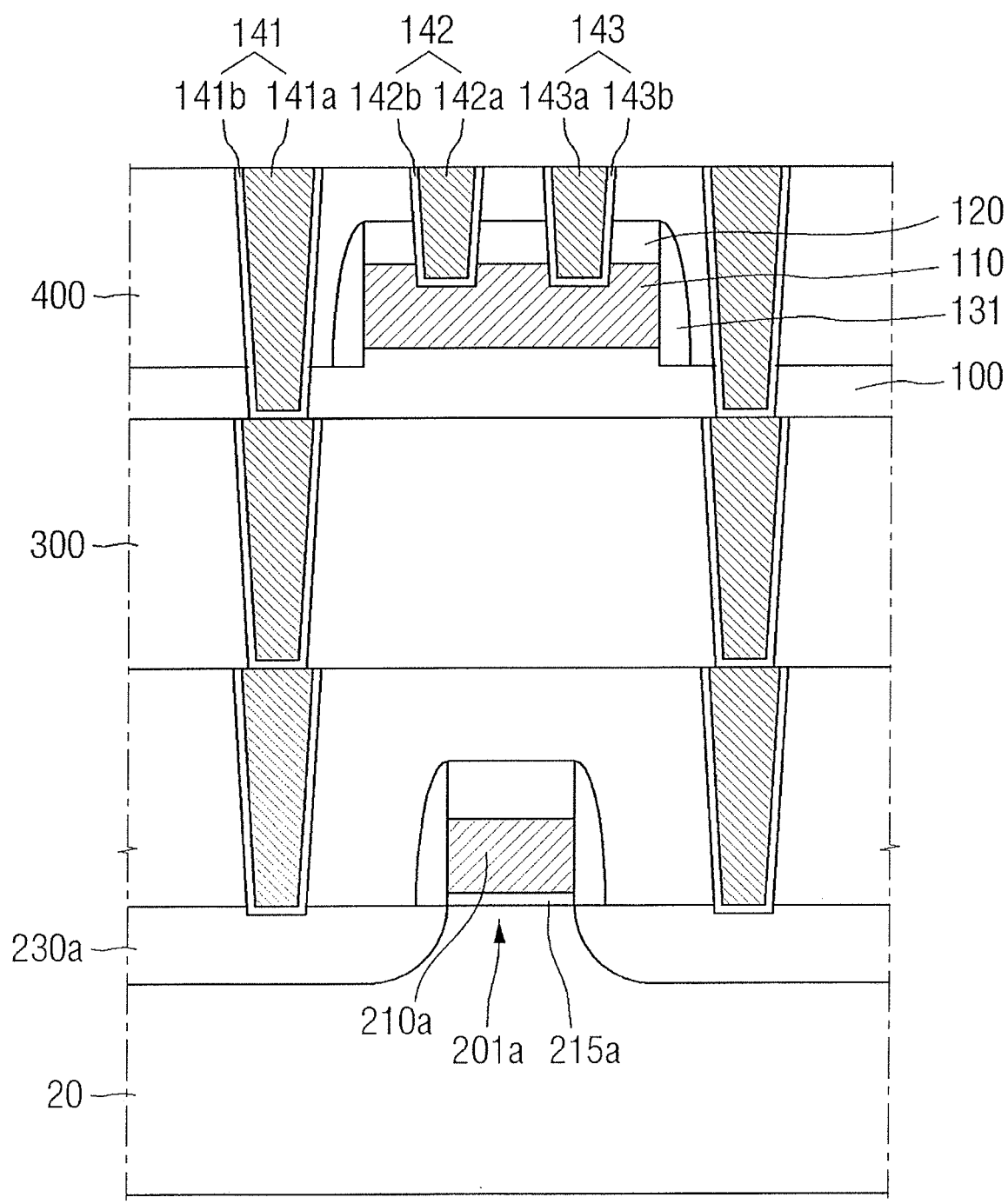

FIG. 25 illustrates a cross-sectional view of a semiconductor device according to some example embodiments.

The semiconductor device according to the exemplary embodiment is substantially the same as the semiconductor device described in FIG. 23, except that the gate structure and the metal resistance pattern vertically overlap with each other. Accordingly, like reference numerals designate like constituent elements, and thus, the duplicated description for like constituent elements may be omitted and differences will be mainly described.

The semiconductor device according to the exemplary embodiment may further include a third interlayer insulation film 400 on the second interlayer insulation film 300. In the third interlayer insulation film 400, the metal resistance pattern 110, the mask pattern 120, and the spacer 131 may be disposed.

In the exemplary embodiment, the gate structure 210a may be adjacent to the substrate 20 and the metal resistance pattern 110 may be spaced apart from the substrate 20.

Figure 26:
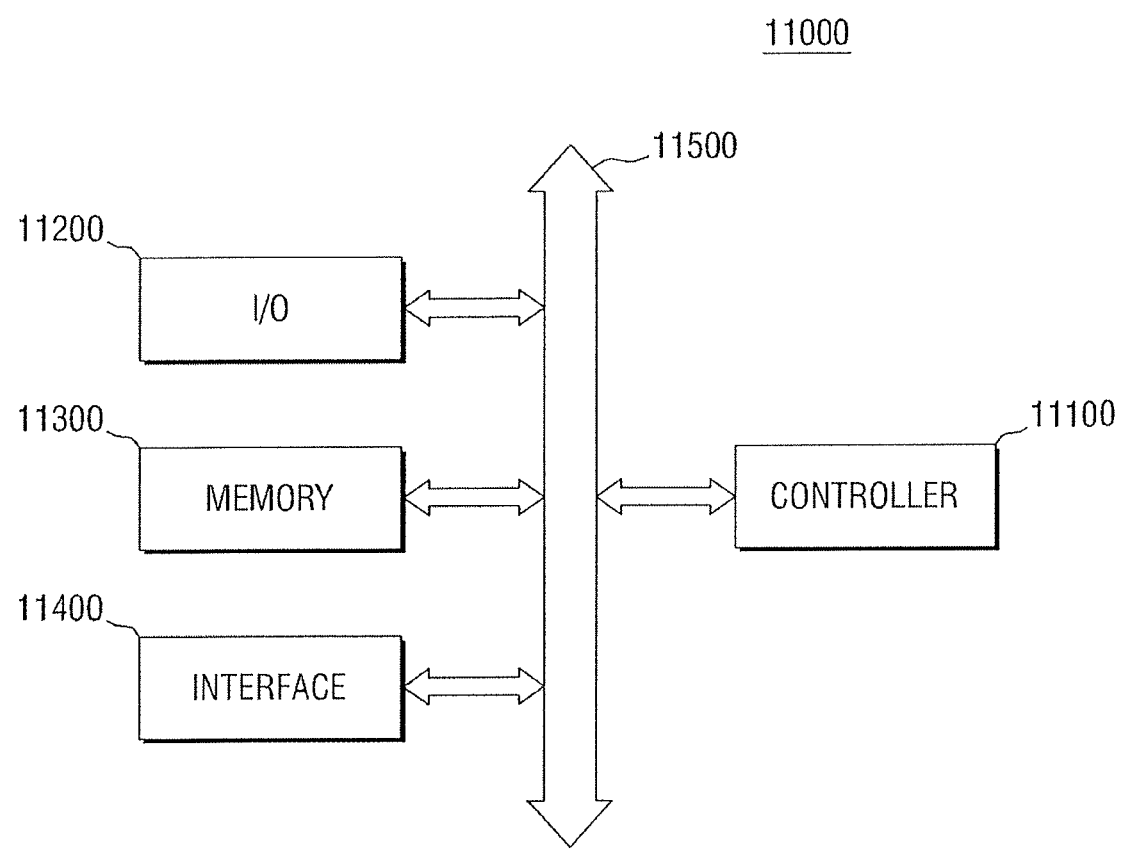
FIG. 26 illustrates a block diagram of an electronic system including the semiconductor device according to some example embodiments.

FIG. 26 illustrates a block diagram of an electronic system including the semiconductor device according to some example embodiments.

Referring to FIG. 26, an electronic system 1000 according to the exemplary embodiment of the example embodiments may include a controller 11100, an I/O device 11200, a memory device 11300, an interface 11400, and a bus 11500. The controller 11100, the I/O device 11200, the memory device 11300, and/or the interface 11400 may be connected to each other through the bus 11500. The bus 11500 corresponds to a path through which data move.

The controller 11100 may include at least one of a microprocessor, a digital signal processor, a microcontroller, and logic elements capable of performing similar functions thereto. The I/O device 11200 may include a keypad, a keyboard, a display device, and the like. The memory device 11300 may store data and/or commands. The interface 11400 may perform a function of transmitting data to a communication network or receiving the data from the communication network. The interface 11400 may be a wired or wireless form. For example, the interface 11400 may include an antenna, a wired/wireless transceiver, or the like. Although not illustrated, the electronic system 11000 may further include a high-speed DRAM and/or S-RAM, as an operational memory for improving the operation of the controller 11100. The semiconductor devices 1 to 11 according to some example embodiments of the example embodiments may be provided in the memory device 11300 or provided as a part of the controller 11100, the I/O device 11200, and the like.

The electronic system 11000 may be applied to a personal digital assistant (PDA), a portable computer, a web tablet, a wireless phone, a smart phone, a mobile phone, a digital music player, a memory card, or all electronic products capable of transmitting and/or receiving information in a wireless environment.

Figure 27:
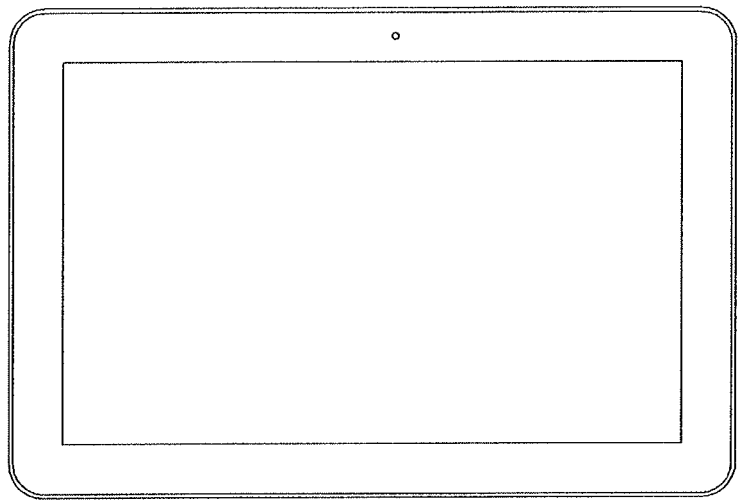
FIG. 27 illustrates an exemplary semiconductor system capable of applying the semiconductor devices according to some example embodiments.

FIG. 27 illustrates an exemplary semiconductor system capable of applying the semiconductor devices according to some example embodiments. The semiconductor devices according to some example embodiments may be used in a tablet PC, a laptop computer, and the like. In an implementation, the semiconductor devices according to some example embodiments may be applied even to other IC circuit devices.

The embodiments may provide a method of forming a semiconductor device including a metal resistance pattern having an excellent characteristic.

The embodiments may provide a semiconductor device having a resistance pattern including metals.

The embodiments may provide a method of manufacturing a semiconductor device having a resistance pattern including metals.

The embodiments may provide a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a metal resistance layer on an insulation layer;

forming a metal resistance pattern and a metal residue on the insulation layer by patterning the metal resistance layer;

forming a spacer layer that covers the metal resistance pattern and the metal residue;

etching the spacer layer such that a spacer is formed that covers a side wall of the metal resistance pattern;

removing the metal residue; and forming a gate contact that extends into the insulation layer, wherein forming the spacer include etching the insulation layer to include a side wall extending along a profile of the spacer.

2. The method as claimed in claim 1, wherein removing the metal residue include using an etch solution having an etch selectivity between the metal residue and the spacer layer and between the metal residue and the metal resistance pattern.

3. The method as claimed in claim 1, wherein forming the spacer includes completely covering the side wall of the metal resistance pattern.

4. The method as claimed in claim 1, further comprising forming a resistance pattern contact that contacts the metal resistance pattern.

5. The method as claimed in claim 4, wherein forming the resistance pattern contact includes passing the resistance pattern contact through the metal resistance pattern to contact the insulation layer.

6. The method as claimed in claim 4, wherein forming the resistance pattern contact includes forming a first lower surface and a second lower surface such that the first lower surface is on a different plane from that of the second lower surface.

7. The method as claimed in claim 6, wherein:
the first lower surface contacts the spacer, and
the second lower surface contacts the metal resistance pattern.

8. The method as claimed in claim 6, wherein the resistance pattern passes through the spacer and the metal resistance pattern such that:
the first lower surface contacts the insulation layer adjacent to the spacer, and
the second lower surface contacts the insulation layer adjacent to the metal resistance pattern.

9. The method as claimed in claim 6, wherein the first lower surface is closer to the insulation layer than the second lower surface is to the insulation layer.

10. The method as claimed in claim 6, wherein:
the first lower surface contacts the spacer, and
the second lower surface contacts the metal resistance pattern.

11. A method of manufacturing a semiconductor device, the method comprising:
forming an insulation layer;
forming a metal resistance pattern on the insulation layer such that a metal residue remains on the insulation layer and spaced apart from the metal resistance pattern;
forming a spacer on a side wall of the metal resistance pattern and a mask pattern on a top surface of the metal resistance pattern such that surfaces of the metal resistance pattern are unexposed;
performing a residue removing process such that the metal residue is removed; and
forming a gate contact that extends into the insulation layer, wherein forming the spacer includes etching the insulation layer to include a side wall extending along a profile of the spacer.

12. The method as claimed in claim 11, further comprising forming a resistance pattern contact that contacts the metal resistance pattern.

13. The method as claimed in claim 12, wherein forming the resistance pattern contact includes passing the resistance pattern contact through the metal resistance pattern to contact the insulation layer.

14. The method as claimed in claim 12, wherein forming the resistance pattern contact includes forming a first lower surface and a second lower surface such that the first lower surface is on a different plane from that of the second lower surface.

15. The method as claimed in claim 14, wherein:
the first lower surface contacts the spacer, and
the second lower surface contacts the metal resistance pattern.

16. A method of manufacturing a semiconductor device, the method comprising:
forming a metal resistance layer on an insulation layer;
forming a metal resistance pattern and a metal residue on the insulation layer by patterning the metal resistance layer;
forming a spacer layer that covers the metal resistance pattern and the metal residue;
etching the spacer layer such that a spacer is formed that covers a side wall of the metal resistance pattern;
removing the metal residue after the spacer is formed; and
forming a resistance pattern contact that extends into the metal resistance pattern,
wherein the resistance pattern contact has a step shape at a bottom end thereof such that the resistance pattern contact includes a first lower surface orthogonal to a depth direction of the resistance pattern contact and a second lower surface, the first lower surface being on a plane that is parallel to but different from that of the second lower surface.

17. The method as claimed in claim 16, wherein:
the first lower surface contacts the spacer, and
the second lower surface contacts the metal resistance pattern.

18. The method as claimed in claim 16, wherein the resistance pattern contact passes through the spacer and the metal resistance pattern such that:
the first lower surface contacts the insulation layer adjacent to the spacer, and
the second lower surface contacts the insulation layer adjacent to the metal resistance pattern.

19. The method as claimed in claim 16, wherein forming the spacer includes etching the insulation layer to include a side wall extending along a profile of the spacer.

* * * * *